US005587271A

United States Patent [19]

Heugebaert et al.

[11] Patent Number: 5,587,271

[45] Date of Patent: Dec. 24, 1996

[54] DAMPENING SOLUTION FOR PRINTING WITH A LITHOGRAPHIC PRINTING PLATE AND A METHOD FOR PRINTING THEREWITH

[75] Inventors: Franciscus Heugebaert, Mortsel; Johan Van Hunsel, Berchem, both of Belgium

[73] Assignee: Agfa-Gevaert, N.V., Mortsel, Belgium

[21] Appl. No.: 538,029

[22] Filed: Oct. 2, 1995

[30] Foreign Application Priority Data

Oct. 18, 1994 [EP] European Pat. Off. .............. 94203008

[51] Int. Cl.$^6$ .............................. G03C 8/06; G03F 7/07

[52] U.S. Cl. .......................... 430/204; 430/302; 101/465

[58] Field of Search ................................ 430/204, 302; 101/465

[56] References Cited

U.S. PATENT DOCUMENTS

| | | | |
|---|---|---|---|
| 3,728,114 | 4/1973 | Futaki et al. | 430/204 |
| 4,361,639 | 11/1982 | Kanada et al. | 430/204 |
| 4,563,410 | 1/1986 | De Jaeger et al. | 430/204 |
| 5,432,042 | 7/1995 | Deprez et al. | 430/204 |

*Primary Examiner*—Richard L. Schilling
*Attorney, Agent, or Firm*—Breiner & Breiner

[57] ABSTRACT

The present invention provides a method for lithographic printing comprising the following steps:

preparing a lithographic printing plate according to the silver salt diffusion transfer process by (1) image-wise exposing an imaging element comprising on a support a photosensitive layer comprising a silver halide emulsion and an image receiving layer containing physical development nuclei in water permeable relationship with said emulsion layer, (2) developing said imaging element in the presence of developing agent(s) and silver halide solvent(s) using an alkaline processing liquid and (3), if said emulsion layer is overlying said image receiving layer, removing the layers overlying said image receiving layer, mounting said lithographic printing plate to a lithographic printing press, and printing while supplying to said lithographic printing plate a dampening solution and a printing ink characterized in that the dampening solution as used on the printing plate contains less than 1.0 g/l of a transparent pigment with an average grain diameter of less than 0.1 μm and at least 0.35 g/l of a clay incorporating an inorganic polyphosphate peptiser.

5 Claims, No Drawings

DAMPENING SOLUTION FOR PRINTING WITH A LITHOGRAPHIC PRINTING PLATE AND A METHOD FOR PRINTING THEREWITH

FIELD OF THE INVENTION

The present invention relates to a method for printing by using dampening solutions and lithographic printing plates obtained according to the silver salt diffusion transfer process.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed e.g. EP-A-423399 and EP-A-410500.

The DTR-image can be formed in the image-receiving layer of a sheet or web material which is a separate element with respect to the photographic silver halide emulsion material (a so-called two-sheet DTR-element) or in the image-receiving layer of a so-called single-support element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

According to a first type disclosed in e.g. U.S. Pat. No. 4,722,535 and GB- 1,241,661 a support is provided in the order given with a silver halide emulsion layer and a layer containing physical development nuclei serving as the image-receiving layer. After information-wise exposure and development the imaged element is used as a printing plate without the removal of the emulsion layer. Printing plates of this type have a printing endurance typically around 10000 copies.

According to a second type a hydrophilic support, mostly anodized aluminum, is provided in the order given with a layer of physical development nuclei and a silver halide emulsion layer. After information-wise exposure and development the imaged element is treated to remove the emulsion layer so that a support carrying a silver image is left wich is used as a printing plate. Printing plates of this type have a higher printing endurance typically at least 25000 copies. Such type of lithographic printing plate is disclosed e.g. in U.S. Pat. No. 3,511,656, EP-A-278766, EP-A-410500 and EP-A-483415.

Said first type of mono-sheet DTR offset printing plates is not compatible with the second type of mono-sheet DTR offset printing plates with regard to dampening solutions and printing inks, which is cumbersome for the printer. In order that said first type of mono-sheet DTR offset printing plates shows no ink acceptance in the non-printing areas (no toning), use should be made of special printing inks and dampening solutions containing an amount of a transparent pigment, usually colloidal siliciumoxide as disclosed e.g. in U.S. Pat. Nos. 3,829,319, 4,238,279 and EP-A 304.662.

Dampening solutions containing an amount of a transparent pigment are however detrimental for use with the second type of mono-sheet DTR offset printing plates because of excessive chemical wear, causing a bad ink acceptance. Still further, such dampening solutions shows a lack of shelf life due to the presence of this transparent pigment in said solutions.

SUMMARY OF THE INVENTION

It is an object of the present invention to provide a method for lithographic printing using a dampening solution and a lithographic printing plate obtained according to the DTR-process showing good printing properties irrespectively of the type of the printing plate i.e. good ink acceptance in the printing areas, no ink acceptance in the non-printing areas and a high printing endurance.

Further objects of the present invention will become clear from the description hereinafter.

According to the present invention there is provided a method for lithographic printing comprising the following steps:

preparing a lithographic printing plate according to the silver salt diffusion transfer process by (1) image-wise exposing an imaging element comprising on a support a photosensitive layer comprising a silver halide emulsion and an image receiving layer containing physical development nuclei in water permeable relationship with said emulsion layer, (2) developing said imaging element in the presence of developing agent(s) and silver halide solvent(s) using an alkaline processing liquid and (3), if said emulsion layer is overlying said image receiving layer, removing the layers overlying said image receiving layer, mounting said lithographic printing plate to a lithographic printing press, and printing while supplying to said lithographic printing plate a dampening solution and a printing ink, characterized in that the dampening solution as used on the printing plate contains less than 1.0 g/l of a transparent pigment with an average grain diameter of less than 0.1 μm and at least 0.35 g/l of a clay incorporating an inorganic polyphosphate peptiser.

According to the present invention there is also disclosed the use of the above mentionned dampening solution in a lithographic printing process.

DETAILED DESCRIPTION OF THE INVENTION

According to the present invention it has been found that a dampening solution for use in a lithographic printing process comprising a water-soluble organic solvent and containing less than 1.0 g/l of a transparent pigment with an average grain diameter of less than 0.1 μm and at least 0.35 g/l of a clay incorporating an inorganic polyphosphate peptiser gives by printing with a lithographic printing plate obtained according to the DTR-process copies showing good printing properties.

According to the present invention dampening solutions as used on the printing plate contain less than 1.0 g/l, preferably less than 0.5 g/l, more preferably less than 0.1 g/l of a transparent pigment with an average grain diameter of less than 0.1 μm; most preferably they are substantially free of such pigment.

In general, said transparent pigment is a non-water swellable, inorganic fine particle with an average grain diameter of less than 0.05 μm, especially a sol of oxide or hydroxide of a metal belonging to Group III-IV of the periodic table such as colloidal siliciumdioxide and colloidal alumina.

According to the present invention dampening solutions as used on the printing plate contains at least 0.35 g/l of a clay incorporating an inorganic polyphosphate peptiser. The upper limit of the amount of said clay is not very important and is determined by practical considerations such as solubility, cost, etc. Preferably, said clay is comprised in the dampening solution in an amount ranging from 0.5 g/l to 10 g/l, more preferably in an amount ranging from 0.7 g/l to 5 g/l.

Clays are essentially hydrous aluminum silicates, wherein alkali metals or alkaline-earth metals are present as principal constituents. Also in some clay minerals magnesium or iron or both replace the aluminum wholly or in part. The ultimate chemical constituents of the clay minerals vary not only in amounts, but also in the way in which they are combined or are present in various clay minerals. Natural clays are well known, but it is also possible to prepare synthetic clays in the laboratory, so that more degrees of freedom can lead to reproducible tailor made clay products for use in different applications.

So from the natural clays smectite clays, including laponites, hectorites and bentonites are well-known. For the said smectite clays some substitutions in both octahedral and tetrahedral layers of the crystal lattice occur, resulting in a small number of interlayer cations. Smectite clays form a group of "swelling" clays which take up water and organic liquids between the composite layers and which have marked cation exchange capacities. From these smectite clays, synthetic chemically pure clays have been produced.

The clays used in accordance with the invention are preferably smectic clays, more preferably synthetic smectic clays, most preferably synthetic laponites, of course incorporating an inorganic polyphosphate peptiser. So preferred synthetic laponite smectite clay additives for the purposes of this invention are e.g. LAPONITE RDS and LAPONITE JS, trade mark products of LAPORTE INDUSTRIES Limited, London.

Said clays and process for the production thereof have been described in EP-Patent 161 411B1.

LAPONITE JS is described as a synthetic layered hydrous sodium lithium magnesium fluoro-silicate incorporating an inorganic polyphoshate peptiser. LAPONITE RDS is described as a synthetic layered hydrous sodium lithium magnesium silicate incorporating an inorganic polyphoshate peptiser. The said silicates appear as free flowing white powder and hydrates well in water to give virtually clear and colourless colloidal dispersions of low viscosity, also called "sols".

Dampening solutions suitable for use in the present invention are preferably aqueous solutions comprising water-soluble organic solvents. Examples of such water-soluble organic solvents include alcohols, polyhydric alcohols, ethers, polyglycols and esters.

Examples of the alcohols include n-butyl alcohol, n-amyl alcohol, n-hexyl alcohol, 2-methylpentanol-1, secondary hexyl alcohol, 2-ethylbutyl alcohol, secondary heptyl alcohol, heptanol-3,2-ethylhexyl alcohol and benzyl alcohol.

Examples of the polyhydric alcohols include ethylene glycol, hexylene glycol, octylene glycol, diethylene glycol and glycerol. Examples of the ethers include ethylene glycol monoethyl ether, ethylene glycol mono-n-hexyl ether, ethylene glycol monophenyl ether, ethylene glycol mono-2-ethylbutyl ether, diethylene glycol monoethyl ether and diethylene glycol mono-n-hexyl ether.

Examples of the esters include diethylene glycol monoethyl ether acetate and diethylene glycol monobutyl ether acetate.

Examples of polyglycols include polyethyleneglycols having an average molecular weight of 400 to 2000, polypropylene glycols having an average molecular weight of 400 to 2000, and block copolymers of ethylene glycol and propylene glycol.

The water-soluble organic solvents are incorporated in the dampening solutions to depress the dynamic surface tension. However, it is preferred to use as little of the organic solvents as possible. With this goal in mind, it was also discovered that dynamic tension can be greatly lowered by the addition of organic solvents having low solubilities in water. As a result, small amounts of such solvents can be effectively used. These type of organic solvents have a solubility of about 0.5 to 80% by weight, preferably 0.5 to 10% by weight, in water at 20° C.

The dynamic surface tension of the dampening solution is lowered by adding said organic solvents, but is preferably not less than 25 dyne/cm, because the dampening solution is an aqueous solution. A dampening solution according to the invention has preferably a dynamic surface tension range from 25 to 50 dyne/cm at 15° C. when measured at most $1*10^{-1}$ second after a surface of said solution is formed on the surface of a printing plate with the NOW-INSTANT WILHELMY DYNAMIC SURFACE TENSION ACCESSORY manufactured by Cahn Co, U.S.A.

The dampening solutions used in the present invention preferably contain from about 0.05 to 5% by weight of these water-soluble organic solvents.

It is preferred that the dampening solutions have a pH comprised between 3 and 6. Usually, mineral acids, organic acids or inorganic salts are added to adjust the pH between 3 and 6. The amount of these compounds to be added are preferably 0.00001 to 0.5% by weight.

Examples of the mineral acids include nitric acid, sulfuric acid and phosphoric acid. Examples of organic acids include citric acid, acetic acid and organic phosphonic acids. These mineral acids, organic acids or inorganic salts may be used either alone or in a combination of two or more of them.

Generally, surfactants are added to the dampening solution to increase the emulsification ratio in ink. The contents of these surfactants should not be higher than 1% by weight, preferably 0.0001 to 0.3% by weight when foaming is taken into consideration.

Preferably, the dampening solution used in the present invention also comprises thickening agents. Examples of thickening agents which can be used in the present invention include water-soluble cellulose derivatives, alginate and derivatives, gum, water-soluble modifications of starch, and water-soluble high-molecular homopolymers and copolymers. These compounds may be used either alone or as a mixture of two or more of them.

The concentration varies depending on the type of the thickening agents, but is preferably about 0.00005 to 1% by weight based on the amount of the dampening solution composition.

In general, the dampening solution used in the present invention comprises a (combination of) preservative(s), so that the composition is effective for controlling various kinds of mold, bacteria and yeast.

In addition to the above-described components, the dampening solution of the present invention may contain chelate compounds preferably in an amount of 0.00001 to 0.3% by weight based on the amount of the dampening solution and corrosion inhibitors preferably in an amount of 0.000001 to 0.5% by weight.

The dampening solution as described above is ready for use as such. In a more preferred embodiment the dampening solution is concentrated and the concentrate is diluted when used. The concentrated dampening water composition of the present invention can be obtained by dissolving the foregoing components in a 10 to a 100 times higher concentration than mentioned above in pure water to give an aqueous solution. The concentrated composition is diluted with sufficient water prior to the practical use in order to give a dampening solution as described above which is suitable for use.

The dampening solution can be used alone or in combination with water-soluble organic solvents e.g. isopropanol or substitutes therefore.

According to one preferred embodiment of the present invention a lithographic printing plate can be obtained by means of the DTR-process using an imaging element comprising on a support in the order given a silver halide emulsion layer and a layer containing physical development nuclei in water permeable relationship with said emulsion layer.

Layers being in water permeable contact with each other are layers that are contiguous to each other or only separated from each other by (a) water permeable layer(s). The nature of a waterpermeable layer is such that it does not substantially inhibit or restrain the diffusion of water or of compounds contained in an aqueous solution e.g. developing agents or the complexed silver.

Supports suitable for use in accordance with the present invention may be opaque or transparent, e.g. a paper support or resin support. When a paper support is used preference is given to one coated at one or both sides with an Alpha-olefin polymer. It is also possible to use an organic resin support e.g. poly(ethylene terephthalate) film or poly-Alpha-olefin films. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used in accordance with the present invention.

The image receiving layer containing physical development nuclei is preferably free of hydrophilic binder but may comprise small amounts up to e.g. 80% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The photosensitive layer used according to the present invention may be any layer comprising a hydrophilic colloid binder and at least one silver halide emulsion, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used.

The average size of the silver halide grains may range from 0.10 to 0.70 μm, preferably from 0.25 to 0.45 μm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

Apart from negative-working silver halide emulsions that are preferred for their high photosensitivity, use can be made also of direct-positive silver halide emulsions that produce a positive silver image in the emulsion layer(s) and a negative image on the image-receiving layer.

Suitable direct positive silver halide emulsions for use in accordance with the present invention are silver halide emulsions that have been previously fogged or that mainly form an internal latent image.

Internal latent image-type silver halide emulsions that can be used in accordance with the present invention have been described in e.g. U.S. Pat. Nos. 2,592,250, 3,206,313, 3,271,157, 3,447,927, 3,511,662, 3,737,313, 3,761,276, GB-A 1,027,146, and JA Patent Publication No. 34,213/77. However, the silver halide emulsions used in the present invention are not limited to the silver halide emulsions described in these documents.

The other type of direct positive type silver halide emulsions for use in accordance with the present invention, which is of the previously fogged type, may be prepared by overall exposing a silver halide emulsion to light and/or by chemically fogging a silver halide emulsion. Chemical fog specks may be formed by various methods for chemical sensitization.

Chemical fogging may be carried out by reduction or by a compound which is more electropositive than silver e.g. gold salts, platinum salts, iridium salts etc., or a combination of both. Reduction fogging of the silver halide grains may occur by high pH and/or low pAg silver halide precipitation or digestion conditions e.g. as described by Wood J. Phot. Sci. 1 (1953), 163 or by treatment with reducing agents e.g. tin(II) salts which include tin(II)chloride, tin complexes and tin chelates of (poly)amino(poly)carboxilic acid type as described in British Patent 1,209,050, formaldehyde, hydrazine, hydroxylamine, sulphur compounds e.g. thiourea dioxide, phosphonium salts e.g. tetra(hydroxymethyl)-phosphonium chloride, polyamines e.g. diethylenetriamine, bis(p-aminoethyl)sulphide and its water-soluble salts, hydrazine derivatives, alkali arsenite, amine borane etc. or mixtures thereof.

When fogging of the silver halide grains occurs by means of a reducing agent e.g. thiourea dioxide and a compound of a metal more electropositive than silver especially a gold compound, the reducing agent is preferably used initially and the gold compound subsequently. However, the reverse order can be used or both compounds can be used simultaneously.

In addition to the above described methods of chemically fogging chemical fogging can be attained by using said fogging agents in combination with a sulphur-containing sensitizer, e.g. sodium thiosulphate or a thiocyanic acid compound e.g. potassium thiocyanate.

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source. e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

In addition to the above described emulsion layer and image receiving layer other hydrophilic colloid layers in water permeable relationship with these layers may be present. For example it is especially advantageous to include a base-layer between the support and the photosensitive silver halide emulsion layer. In a preferred embodiment said base-layer serves as an antihalation layer. On the other hand, in order to gain sensitivity, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with this photographic material a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Suitable surface-active agents include non-ionic agents, anionic agents comprising an acid group, ampholytic agents and cationic agents. Preferably compounds containing perfluorinated alkyl groups are used.

This photographic material suitable for use in the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, alpha-beta-unsaturated dicarboxylic acids, hydroxyalkyl (meth)acrylates, sulphoalkyl (meth)acrylates, and styrene sulphonic acids.

The imaging element according to said embodiment may be imaged by means of a wide choice of cameras, existing on the market. Horizontal, vertical and darkroom type cameras and contact-exposure apparatus are available to suit any particular class of reprographic work. The imaging element can also be exposed in accordance with the present invention with the aid of i.a. laser recorders and cathode ray tubes.

Subsequently, said photographic material is developed with the aid of an aqueous alkaline solution in the presence of (a) developing agent(s) and (a) silver halide solvent(s).

The alkaline processing liquid used for developing the imaging element in accordance with the method of the present invention preferably contains a silver halide solvent. Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones and thiosulfates. Silver halide solvents that are preferably used in connection with the present invention are thiocyanates and alkanolamines.

Alkanolamines that are suitable for use in connection with the present invention may be of the tertiary, secundary or primary type. Examples of alkanolamines that may be used in connection with the present invention correspond to the following formula:

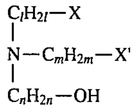

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or mixtures thereof.

According to the present invention the alkanolamines are preferably present in the alkaline processing liquid. However part or all of the alkanolamine can be present in one or more layers of the imaging element.

A further suitable type of silver halide solvents are thioether compounds. Preferably used thioethers correspond to the following general formula:

$$Z—(R^1—S)_t—R^2—S—R^3—Y$$

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 547,662, which therefor are incorporated herein by reference.

Still further suitable silver halide solvents are meso-ionic compounds. Preferred meso-ionic compounds for use in connection with the present invention are triazolium thiolates and more preferred 1,2,4-triazolium-3-thiolates.

According to a preferred embodiment of the present invention at least part and most preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l.

However the meso-ionic compound may be incorporated in one or more layers comprised on the support of the imaging element. The meso-ionic compound is in that case preferably contained in the imaging element in a total amount between 0.1 and 10 mmol/$m^2$, more preferably between 0.1 and 0.5 mmol/$m^2$ and most preferably between 0.5 and 1.5 mmol/$m^2$. More details are disclosed in EP-A-0,554,585

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc. . Examples of 1-phenyl-3-pyrazolidones subsituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. . However other developing agents can be used.

At least the auxiliary developing agents are preferably incorporated into the photographic material, preferably in the silver halide emulsion layer of the photographic material, in an amount of less than 150 mg/g of silver halide expressed as $AgNO_3$, more preferably in an amount of less than 100 mg/g of silver halide expressed as $AgNO_3$.

According to the present invention the alkaline processing liquid used for developing an imaging element as described above preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. No. 3,776,728, and U.S. Pat. No. 4,563,410. Preferred compounds correspond to one of the following formulas:

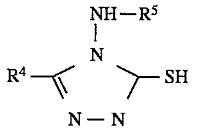

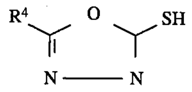

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners. In accordance with the present invention it is furthermore preferred to use a spreading agent or surfactant in the alkaline processing liquid to assure equal spreading of the alkaline processing liquid over the surface of the photographic material. Such a surfactant should be stable at the pH of the alkaline processing liquid and should assure a fast overall wetting of the surface of the photographic material. A surfactant suitable for such purpose is e.g. a fluor containing surfactant such as e.g. $C_7F_{15}COONH_4$. It is furthermore advantageous to add glycerine to the alkaline processing liquid so as to prevent crystallization of dissolved components of said alkaline processing liquid.

Development acceleration can be accomplished by addition of various compounds to the alkaline processing liquid and/or one or more layers of the photographic element, preferably polyalkylene derivatives having a molecular weight of at least 400 such as those described in e.g. U.S. Pat. Nos. 3,038,805—4,038,075—4,292,400—4,975,354.

Subsequent to the development in an alkaline processing liquid in accordance with the present invention the surface of the printing plate is preferably neutralized using a neutralization liquid.

A neutralization liquid generally has a pH between 5 and 8. The neutralization liquid preferably contains a buffer e.g. a phosphate buffer, a citrate buffer or mixture thereof. The neutralization solution can further contain bactericides, substances which influence the hydrophobic/hydrophilic balance of the printing plate obtained after processing of the DTR element, e.g. hydrophobizing agents as described above, silica and wetting agents, preferably compounds containing perfluorinated alkyl groups.

A lithographic plate is thus obtained.

According to another preferred embodiment of the present invention a lithographic printing plate can be obtained by means of the DTR-process using an imaging element comprising in the order given a hydrophilic surface of a support, a layer of physical development nuclei and a silver halide emulsion layer.

Said hydrophilic surface of a support can be a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference.

Flexible supports e.g. a paper support or a resin support are described above.

Said hydrophilic surface of a support may be a hydrophilic metallic support e.g. an aluminum foil.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a CLA value between 0.2 and 1.5 μm, an anodization layer with a thickness between 0.4 and 2.0 μm and is sealed with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like HCl, $HNO_3$, $H_2SO_2$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc. . . .

Electrochemical graining in connection with the present invention can be performed using single-phase and three-phase alternating current. The voltage applied to the aluminum plate is preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

The roughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably toughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ $Al_2O_3.H_2O$. The anodized aluminum foil may subsequently with demineralized water within a temperature range of 10°–80° C.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

Preferably, said sealing is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

The imaging element of the present embodiment may be imaged using a camera-exposure or a scanning exposure as described above followed by a development step in the presence of development agent(s) and silver halide solvent(s) according to the invention so that a silver image is formed in the physical development nuclei layer. Subsequently the silver halide emulsion layer and any other optional hydrophilic layers are removed by e.g. rinsing the imaged element with water, preferably between 30° C. and 50° C. so that the silver image is exposed.

To facilate the removal of the silver halide emulsion layer it is advantageous to provide a layer between the hydrophilic surface of a support and the silver halide emulsion layer comprising a hydrophilic non-proteinic film-forming polymer e.g. polyvinyl alcohol, polymer beads e.g. poly(meth)acrylate beads or mixtures thereof. Such type of layers are disclosed in EP-A-483415 and EP-A-410500.

Finally said exposed imaged surface of the hydrophilic support is preferably treated with a finisher to enhance the water-receptivity of the non-image areas and to make the image areas oleophilic ink-receptive.

The lithographic composition often called finisher comprises at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyvinyl alcohol and preferably polyglycols, being the reaction products of ethyleneoxide and/or propyleneoxide with water or an alcohol. Optionally, hygroscopic substances e.g. sorbitol, glycerol, tri(hydroxyethyl)ester of glycerol, and turkey red oil may be added.

In accordance with the present invention in a following step the lithographic plate is mounted on a lithographic press and treated with a dampening solution as described above and with a lithographic ink in order to print.

Any of the conventional lithographic inks can be used in the present invention. Examples of the lithographic inks include general process color ink, offset printing ink, multicolor ink, gold and silver ink, UV ink, ink for synthetic paper, fluoresent ink and metallic ink etc. .

The dampening system suitable for use in the present invention is preferably an integrated system, whereby the dampening solution and the ink are brought into contact with each other before applying them to the lithographic plate e.g. by feeding the dampening solution to inked rollers. The dampening system used in the present invention may also be a separated system, whereby the dampening solution is fed to the lithographic plate using rubber rollers independent of the inked rollers. Also hybrid dampening systems may be used in the present invention, whereby some dampening solution is brought into contact with the ink before applying the mixture to the lithographic plate and some dampening solution is fed to the lithographic plate using rubber rollers independent of the inked rollers.

As printing press any lithographic printing press can be used.

Printing can be effected on any ink-receptive element i.a. depending on the required printing effect. In general, paper is used but even cardboard can be used.

The following examples illustrate the present invention without limiting it thereto. All percentages are by weight unless stated otherwise.

EXAMPLE 1

Preparation of the silver halide emulsion coating solution.

A silver chlorobromide emulsion composed of 98 mole % of chloride, 1.7 mole % of bromide and 0.3 mole % of iodide was prepared by the double jet precipitation method. The average silver halide grain size was 0.4 μm (diameter of a sphere with equivalent volume) and contained Rhodium ions as internal dopant. The emulsion was orthochromatically sensitized and stabilized by 1-phenyl-5-mercaptotetrazole.

A base layer coating solution was prepared having the following composition:

| | |
|---|---|
| gelatin | 5.5% |
| carbon black | 0.76% |
| silica particles (5 μm) | 1.6% |

Preparation of the imaging elements I.

The emulsion coating solution and base layer coating solution were simultaneously coated by means of the cascade coating technique to a polyethylene terephthalate support provided with a pack of two backing layers such that the base layer coating was coated directly to the side of the support opposite to the side containing said backing layers. The emulsion layer was coated such that the silver halide coverage expressed as $AgNO_3$ was 1.5 $g/m^2$ and the gelatin content was 1.5 $g/m^2$. The emulsion layer further contained 0.15 $g/m^2$ of 1-phenyl-4,4'-dimethyl-3-pyrazolidone and 0.25 $g/m^2$ of hydroquinone. The base layer was coated such that the amount of gelatin in the coated layer was 3 $g/m^2$.

The layer nearest to the support of the backing layer pack contained 0.3 $g/m^2$ of gelatin and 0.5 $g/m^2$ of the antistatic agent co(tetraallyloxyethane/methacrylate/acrylic acid-K-salt) polymer. The second backing layer contained 4 $g/m^2$ of gelatin, 0.15 $g/m^2$ of a matting agent consisting of transparent spherical polymeric beads of 3 micron average diameter according to EP-A 80225, 0.05 $g/m^2$ of hardening agent triacrylformal and 0.021 $g/m^2$ of wetting agent $F_{15}C_7$—$COONH_4$.

The thus obtained element was dried and subjected to a temperature of 40° C. for 5 days and then the emulsion layer was overcoated with a layer containing PdS as physical development nuclei, hydroquinone at 0.4 $g/m^2$ and formaldehyde at 100 $mg/m^2$.

The following processing solutions were prepared:

| | |
|---|---|
| Activator | |
| potassium hydroxide (g) | 30 |
| sodium sulphite anh. (g) | 35 |
| potassium thiocyanate (g) | 20 |
| 2-mercapto-5-n.heptyl-oxa-3,4-diazole (mg) | 300 |
| potassium bromide (mg) | 280 |
| water to make | 1 l |
| Neutralization solution | |
| citric acid | 10 g |
| sodium citrate | 35 g |
| sodium sulphite anh. | 5 g |
| phenol | 50 mg |
| water to make | 1 l |

Four imaging elements as described above were imagewise exposed and processed with the above described activator, subsequently neutralized at 25° C. with the neutralization solution described above and dried. A printing plate I was so obtained.

Four printing plates I thus prepared were mounted on the same offset printing machine AB DICK 360, marketed by AB Dick Co, USA, equipped with a Varn Kompac II dampening system, marketed by Varn Products Co Ltd, Manchester, UK. They were printed under similar conditions except for the composition of the dampening solutions, which is given in table 1. The ink VAN SON RB 2329 and a compressible rubber blanket were used. The plates were printed to provide 500 copies.

The results are summed up in table 1.

| Dampening solution | Cd-1 | CD-2 |
|---|---|---|
| Sodium Hydroxide | 10.3 g | 8 g |
| Citric acid | 26.2 g | 42 g |
| Hexylene glycol | 200 g | 200 g |
| Glycerine | 500 g | 250 g |
| BROXAN | 3.5 ml | 0.6 ml |
| Water to make | 1 l | 1 l |

TABLE 1

| Dampening solution | D-1 | D-2 | D-3 | D-4 |
|---|---|---|---|---|
| CD-1 (ml) | 50 | 50 | 50 | 50 |
| LAPONITE JS (g) | 3 | 1.5 | — | — |
| LAPONITE RDS (g) | — | — | 3 | — |

TABLE 1-continued

| Dampening solution | D-1 | D-2 | D-3 | D-4 |
|---|---|---|---|---|
| Isopropanol (ml) | 50 | 50 | 50 | 50 |
| Water to make | 1 l | 1 l | 1 l | 1 l |
| Toning[a)] | 0 | 0 | 0 | 5 |

[a)]Toning:
0: no toning observed till the 500th copy
5: heavy toning observed from the first copies.

As can be seen from table 1 a method for lithographic printing using a lithographic printing plate obtained according to the DTR-process from an imaging element comprising on a support in the order given a silver halide emulsion layer and a layer containing physical development nuclei serving as the image-receiving layer and a dampening solution containing LAPONITE JS or LAPONITE RDS showed good printing properties e.g. no toning. On the other hand a method, using identical printing plates and a dampening solution containing neither LAPONITE JS nor LAPONITE RDS gave bad printing properties e.g. heavy toning from the first copy.

EXAMPLE 2

Five printing plates I were prepared as described in example 1 and were used for printing in a similar way as described in example 1 except for the composition of the dampening solutions, which is given in table 2. The plates were printed to provide 500 copies.

The results are summed up in table 2.

TABLE 2

| Dampening Solution | D-5 | D-6 | D-7 | D-8 | D-9 |
|---|---|---|---|---|---|
| CD-2[a)] (ml) | 50 | 50 | 50 | 50 | 50 |
| LAPONITE JS (g) | 1.5 | 0.75 | 0.75 | 0.37 | — |
| Isopropanol (ml) | 50 | 50 | 0 | 50 | 50 |
| Water to make | 1 l | 1 l | 1 l | 1 l | 1 l |
| Toning[b)] | 0 | 0 | 0 | 3 | 5 |

[a)]CD-2: composition see example 1
[b)]Toning
0 - no toning observed till the 500th copy
3 - slight toning observed from the 100th copy
5 - heavy toning observed from the first copies.

As can be seen from table 2 a method for lithographic printing using a lithographic printing plate obtained according to the DTR-process from an imaging element comprising on a support in the order given a silver halide emulsion layer and a layer containing physical development nuclei and a dampening solution containing LAPONITE JS in a concentration as low as 0.75 g/l showed excellent printing properties e.g. no toning. This is even true when no isopropanol was used in the dampening solution. The same method, using a dampening solution containing LAPONITE JS in a concentration as low as 0.37 g/l showed marginal printing properties in respect to toning. On the other hand a method, using an identical printing plate and a dampening solution containing no LAPONITE JS gave bad printing properties e.g. heavy toning from the first copy.

EXAMPLE 3

An imaging element II was obtained by coating a grained, anodized and sealed aluminium support with a silver-receptive stratum containing 0.7 mg/$m^2$ PdS as physical development nuclei.

An intermediate layer was then provided on the dry silver-receptive stratum from an aqueous composition in such a way that the resulting dried layer had a weight of 0.5 g of polymethyl methacrylate beads per $m^2$, said composition comprising:

| | |
|---|---|
| a 20 % dispersion of polymethyl methacrylate beads in a mixture of equal volumes of water and ethanol having an average diameter of 1.0 μm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water | 300 ml |
| (pH-value: 5.6) | |

Finally a substantially unhardened photosensitive negative-working cadmium-free gelatin silver chlorobromoiodide emulsion layer (97.98/2/0.02 mol %) was coated on the intermediate layer, the silver halide being provided in an amount corresponding to 2.40 g of silver nitrate per $m^2$ and the gelatin content of the emulsion layer being 0.58 g/$m^2$ of ROUSSELOT T10985 (marketed by Rousselot S. A., France) and 1 g/$m^2$ of KOEPF T7598 (marketed by Koepf A. G., Germany.)

The imaging element II was exposed through a contact screen in a process-camera and immersed for 8 s at 24° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to form a silver image in the image receiving layer.

To remove the developed silver halide emulsion layer and the intermediate layer from the aluminium foil the developed monosheet DTR material was rinsed for 10 s with a water jet at 30° C.

Next, the imaged surface of the aluminum foil was rubbed with a finisher to enhance the water-receptivity of the non-image areas and to make the image areas oleophilic ink-receptive. The fixer had the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| sodium hydroxide | 5.5 g |
| water to make | 1000 ml |
| pH (20° C.) = 4 | |

A printing plate II was so obtained.

Four printing plates II were rubbed with a cotton pad, soaked in respectively the solutions D-10 to D-13 and subsequently mounted beside each other on the same offset printing machine HEIDELBERG GTO-52, equipped with a Dahgren integrated dampening system and were printed under identical conditions. Commercial ROTOMATIC 100% was used as dampening solution. Ink HARTMANN S 6920 and a compressible rubber blanket were used. The plates were printed to provide 25 copies.

The composition of the solutions D-10 to D-13 and the results are summed up in table 3.

TABLE 3

| Solution | D-10 | D-11 | D-12 | D-13 |
|---|---|---|---|---|
| LAPONITE JS (g) | 150 | — | — | — |
| LAPONITE RDS (g) | — | 50 | — | — |
| $SiO_2$[b] (g) | | | 75 | |
| Water to make (1) | 1 | 1 | 1 | 1 |
| INK ACCEPTANCE[c] | 0 | 0 | 5 | 0 |

[a]CD-2: composition: see example 1
[b]$SiO_2$: Kieselsol 300F-30 (BAYER)
[c]Ink acceptance:
0: complete ink acceptance on the printing areas from the first plate
5: very bad ink acceptance on the printing areas from the first plate As can be seen from table 3 a method for lithographic printing using a lithographic printing plate obtained according to the DTR-process from an imaging element comprising on an aluminum support in the order given a layer containing physical development nuclei and a silver halide emulsion layer and rubbed with a solution containing LAPONITE JS or LAPONITE RDS showed good printing properties i.e. very good ink acceptance of the printing areas. On the other hand a method, using an identical printing plate and a solution containing Kieselsol 300F-30 (colloidal siliciumoxide with an average grain diameter of less than 0.1 μm) gave a very bad ink acceptance of the printing areas. This bad ink acceptance is due to chemical wear i.e. the removal of the hydrophobic silver areas from the hydrophilic aluminum support by the rubbing with colloidal siliciumdioxide. It has been proven that this chemical wear also happens, although at a slower rate, when the printing plate is not rubbed with said solution but come in contact during the printing process with a dampening solution which also contains $SiO_2$ although in a much lower concentration.

It is thus clear from the results of example 1,2 and 3 that a dampening solution containing as used on the printing plate no siliciumdioxide with an average grain diameter of less than 0.1 μm and at least 0.35 g/l of LAPONITE JS or RDS is suitable for use in lithographic printing using a lithographic printing plate obtained according to the DTR-process either from an imaging element comprising on a support in the order given a silver halide emulsion layer and a layer containing physical development nuclei or from an imaging element comprising on a hydrophilic surface of a support in the order given a layer containing physical development nuclei and a silver halide emulsion layer.

We claim:

1. A method for lithographic printing comprising the following steps:

preparing a lithographic printing plate according to the silver salt diffusion transfer process by (1) image-wise exposing an imaging element comprising on a support a photosensitive layer comprising a silver halide emulsion and an image receiving layer containing physical development nuclei in water permeable relationship with said emulsion layer, (2) developing said imaging element in the presence of developing agent(s) and silver halide solvent(s) using an alkaline processing liquid and (3), if said emulsion layer is overlying said image receiving layer, removing the layers overlying said image receiving layer, mounting said lithographic printing plate to a lithographic printing press, and printing while supplying to said lithographic printing plate a dampening solution and a printing ink characterized in that the dampening solution as used on the printing plate contains less than 1.0 g/l of a transparent pigment of a non-water swellable inorganic fine particle with an average grain diameter of less than 0.1 μm and at least 0.35 g/l of a clay incorporating an inorganic polyphosphate peptiser.

2. A method according to claim 1 wherein said dampening solution contains less than 0.5 g/l of a transparent pigment with an average grain diameter of less than 0.1 μm.

3. A method according to claim 1 wherein said dampening solution contains said clay in an amount ranging from 0.5 g/l to 10 g/l.

4. A method according to claim 1 wherein said clay is a synthetic smectite clay.

5. A method according to claim 1 wherein said clay is a synthetic laponite clay.

* * * * *